United States Patent [19]
Kleinberg

[11] Patent Number: 5,576,663
[45] Date of Patent: Nov. 19, 1996

[54] WIDEBAND GAIN STABLE AMPLIFIER

[75] Inventor: Leonard L. Kleinberg, Greenbelt, Md.

[73] Assignee: The United States of America as represented by the United States National Aeronautics and Space Administration, Washington, D.C.

[21] Appl. No.: 412,776

[22] Filed: Mar. 24, 1995

[51] Int. Cl.$^6$ ........................................... H03F 3/189
[52] U.S. Cl. ........................... 330/306; 330/107; 330/294
[58] Field of Search ................................. 330/107, 294, 330/306; 327/588

[56] References Cited

U.S. PATENT DOCUMENTS

T904,030  1/1972  Davie .................................. 330/294 X

FOREIGN PATENT DOCUMENTS 18150  2/1977  Japan .................................... 330/107

OTHER PUBLICATIONS

Della Mussia, "Integrated Amplifiers", *Electron. & Appl. Ind.* (France) No. 275, Nov. 1, 1979 p. 35.
Wyland, "Power of Amp Provides ±100-mA Output and Up to 100-V/μs Slew Rate", *Electronic Design* 10 May 10, 1973, p. 146.

*Primary Examiner*—James B. Mullins
*Attorney, Agent, or Firm*—Robert D. Marchant

[57] ABSTRACT

A method and apparatus for increasing the bandwidth of an operational amplifier and including a capacitor being connected across the inverting and non-inverting inputs of the operational amplifier and further including a feedback circuit connected from the output to one of the inputs, the inverting input, and wherein the value of the capacitance is selected such that the time constant of an RC network including the capacitance and the feedback circuit impedance is proportional to the inverse of the product of the closed loop gain and a factor β which equates the absolute value of the gain at two different frequencies.

18 Claims, 1 Drawing Sheet

WIDEBAND GAIN STABLE AMPLIFIER

ORIGIN OF THE INVENTION

The invention described herein was made by an employee of the United States Government, and may be manufactured and used by or for the Government for governmental purposes without the payment of any royalties thereon or therefor.

BACKGROUND OF THE INVENTION

1. Technical Field

This invention pertains generally to electrical signal amplifiers and more particularly to the type of amplifiers known as operational amplifiers.

2. Description of the Prior Art

Operational amplifiers are generally well known to those skilled in the art of electronics circuit design and have widespread applications. It is also well known that such a device has an inherent gain vs. frequency characteristic which is constant from DC or 0 Hz up to a known drop-off or roll-off frequency where a 3 db drop in gain occurs and defines the amplifier's bandwidth. As analog to digital converters increase in speed and the number of bits converted, wideband amplifiers having a constant gain over a required frequency range presents a very serious problem. The speed of new signal processing systems is therefore limited by the available analog electronic circuitry comprised of one or more amplifier devices and those implemented by the use of current state of the art operational amplifiers, not only by the gain stability required, but also by the settling time of the amplifier.

SUMMARY

Accordingly, it is an object of the present invention to provide an improvement in electrical signal amplifiers.

It is another object of this invention to provide an improvement in operational amplifiers.

It is yet another object of the invention to provide an improvement in the gain bandwidth characteristics of non-inverting and inverting operational amplifiers.

It is a further another object of this invention to provide an improvement in the gain-bandwidth characteristic of a voltage feedback operational amplifier having a one-pole frequency response.

It is still another object of the invention to provide an improvement in the gain bandwidth characteristic of a voltage follower type of operational amplifier.

Briefly, the foregoing and other objects of the invention are achieved by a method and apparatus for increasing the bandwidth of an operational amplifier and including a capacitor being connected across the inverting and non-inverting inputs of the operational amplifier and including a feedback circuit connected from the output to one of the inputs, the inverting input, and wherein the value of the capacitance is selected such that the time constant of an RC network including the capacitance and the feedback circuit impedance is proportional to the inverse of the product of the closed loop gain and a factor $\beta$ which equates the absolute value of the gain at two different operational frequencies.

BRIEF DESCRIPTION OF THE DRAWINGS

The following detailed description will be more readily understood when considered together with the drawings wherein.

DETAILED DESCRIPTION OF THE INVENTION

Figure 1A:
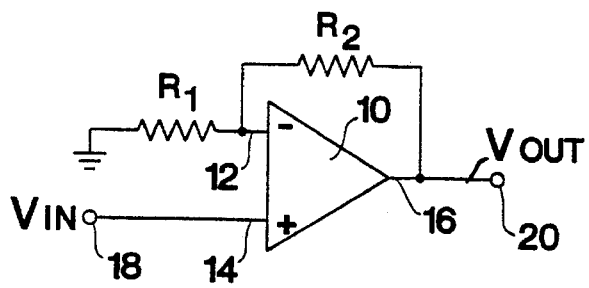
FIGS. 1A and 1B depict electrical schematic diagrams illustrative of typical prior art non-inverting and inverting operational amplifiers.

Referring now to the drawings and first to FIG. 1A, shown thereat is a conventional non-inverting operational amplifier circuit including an operational amplifier (op-amp) 10 having an inverting(−) input 12, a non-inverting (+) input 14, and an output 16. The non-inverting(+) input 14 of this circuit configuration is connected to an input terminal 18 to which is applied an input signal $V_{in}$. The output 16 of op-amp 10 is connected to an output terminal 20 which provides an output signal $V_{out}$.

The non-inverting op-amp circuit additionally includes a resistive type feedback network from the output 16 to the inverting(−) input 12 and comprises a resistive voltage divider including a pair of fixed resistors $R_1$ and $R_2$. The resistor $R_1$ is connected from the inverting(−) input 12 to ground while the second resistor $R_2$ is connected from the output 16 to the inverting(−) input 12 of the op-amp 10.

In such a circuit configuration, a portion of the output voltage $V_{out}$ is coupled back to the inverting(−) input 12 depending upon the resistance values of $R_1$ and $R_2$. The magnitude of the feedback voltage coupled to the inverting(−) input 12 is equal to $\alpha V_{out}$, where, $$\alpha = R_1/R_1 + R_2 \tag{1}$$

As is well known, the gain K of an amplifier is defined as:

$$K = V_{out}/V_{in} \tag{2}$$

Furthermore, it can be shown that the gain K can also be expressed as:

$$K = K(f)/1 + \alpha K(f) \approx 1/\alpha + j(f/f_G) \tag{3}$$

Where K(f) comprises the single pole transfer function at a frequency f, j is the complex operator used in vector notation, and $f_G$ is the gain-bandwidth product. Accordingly, K(f) can be expressed as:

$$K(f) = K_0/1 + j(f/f_3) \tag{4}$$

where $K_0$ is the open loop or DC gain at 0 Hz, $f_3$ is the frequency at which the gain drops off by 3 dB, and the gain bandwidth product $f_G$ is, $$f_G = f_3 K_0 \tag{5}$$

When desirable, the frequency f can be expressed in terms of angular frequency $\omega$, where $\omega = 2\pi f$.

The absolute value or magnitude of the gain K at a frequency f then becomes:

$$|k_f|=1/[\alpha^2+(f/f_G)^2]^{1/2} \quad (6)$$

In a typical example for an operational amplifier, such as shown in FIG. 1A, operating at high frequencies, i.e. above 1 mHz, and where $R_2=4R_1$ and thus $\alpha=0.2$, $K_0=10^5$, $f_3=2\times 10^3$ Hz and $f_G=2\times10^8$, Table 1 below is illustrative of the magnitude of the gain $|K_f|$ between the frequencies of 1 mHz and 40 mHz.

TABLE 1

| f (mHz) | $|k_f|$ |
|---|---|
| 1 | 4.9984 |
| 2 | 4.9938 |
| 5 | 4.9614 |
| 10 | 4.8507 |
| 40 | 3.5355 |

Table 1 indicates that the 3 dB drop-off frequency occurs in the region of 40 mHz.

Figure 1B:
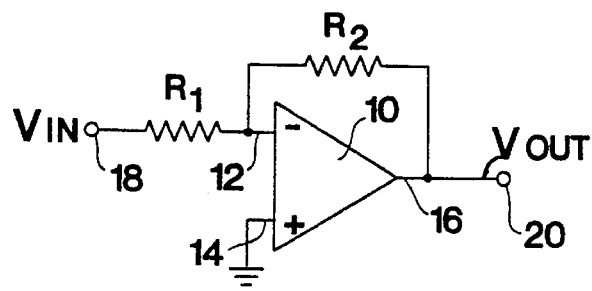

Considering now FIG. 1B, shown thereat is a conventional inverting operational amplifier circuit, also including OP-AMP 10; however, now the input terminal 18 is coupled to the inverting (−) input 12 through fixed resistor $R_1$, while the non-inverting (+) input 14 is connected to ground. The fixed resistor $R_2$ is connected from the output 16 to the inverting (−) input 12 in the same manner as the non-inverting operational amplifier circuit of FIG. 1A.

For the inverting operational amplifier configuration of FIG. 1A, K(f) is:

$$K(f)=-K_0/1+j(f/f_3) \quad (7)$$

Furthermore, it can be shown that the gain $K_f$ at a frequency f can be expressed as:

$$K_f=j(f_G/f)/[1+R_1/R_2]-j[f_G/f\times R_1/R_2] \quad (8)$$

or $$K_f=-(f_G/f)/(f_G/f\times R_1/R_2)+j(1+R_1/R_2) \quad (9)$$

The absolute magnitude of the gain $K_f$ of equation (9) can be expressed as:

$$|K_f|=(f_G/f)/\{(f_G/f\times R_1/R_2)^2+(1+R_1/R_2)^2\}^{1/2} \quad (10)$$

For an operational amplifier as shown in FIG. 1B where $R_1/R_2=0.2$, $K_0=10^5$, $f_3=2\times10^3$ Hz and $f_G 2\times10^8$, Table 2 below illustrates the value $|K_f|$ between the frequencies f and 1 mHz and 10 mHz.

TABLE 2

| F (mHz) | $|K_f|$ |
|---|---|
| 1 | 4.99775 |
| 2 | 4.99102 |
| 5 | 4.94468 |
| 10 | 4.78913 |

Figure 4:
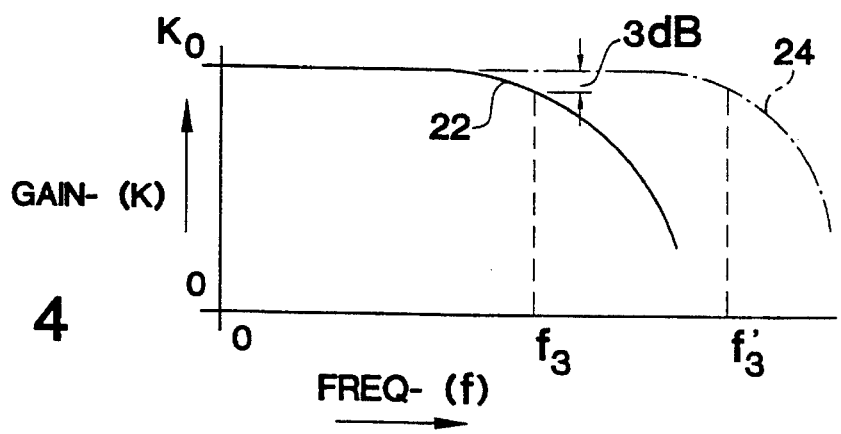
FIG. 4 is a graph illustrative of the improved gain vs. frequency characteristic achieved by the subject invention.

This now leads to a consideration of the inventive concept of the subject invention and which has for its purpose increasing the bandwidth of the operational amplifiers shown in FIGS. 1A and 1B to provide a considerably higher 3 dB drop-off frequency $f'_3$ as shown by the curve portion 24 of FIG. 4.

Figure 2A:
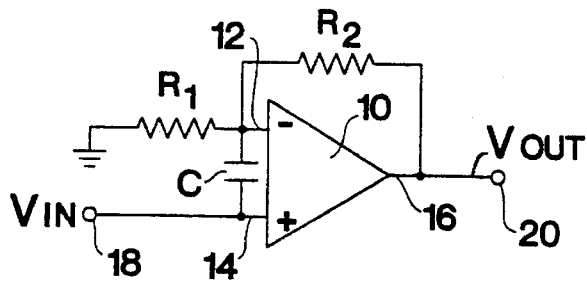
FIGS. 2A and 2B depict electrical schematic diagrams illustrative of non-inverting and inverting operational amplifiers incorporating the inventive concept of the subject invention.
Figure 2B:
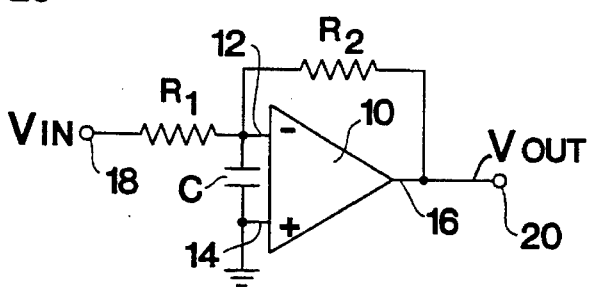

This is achieved in accordance with the subject invention by coupling a capacitive reactance, such as a fixed capacitor C, across the inverting(−) and non-inverting(+) inputs 12 and 14 of the operational amplifiers 10 as shown in FIGS. 2A and 2B. One end of the capacitor C is connected at the common junction between the fixed resistors $R_1$ and $R_2$ and the inverting (−) input 12, while the other end is common to the input terminal 18 and the non-inverting (+) input 14.

Depending upon the resistance values of the resistors $R_1$ and $R_2$, the capacitance value for C in FIG. 2A is selected such that:

$$R_{12}C=1/f_C\times 2\pi=1/\omega_C \quad (11)$$

where, $$R_{12}=R_1R_2/R_1+R_2, \text{ and} \quad (12)$$

$$f_C=\alpha f_G\beta \quad (13)$$

where $\alpha f_G$ is the closed loop gain and $\beta$ is a factor which equates the absolute value $|K_f|$ of the gain $K_f$ at two different frequencies $f_m$ and $f_n$.

This can be explained as follows. The gain $K_f$ of the circuit shown in FIG. 2 can be expressed as:

$$K_f=j(f_G/f)/1-j[(f_G/f)\alpha-f/f_C] \quad (14)$$

The absolute magnitude of the gain $K_0$ of equation (14) can be expressed as:

$$|K_f|=(f_G/f)/\{1+[(f_G/f)\alpha-f/f_C]^2\}^{1/2} \quad (15)$$

or $$|K_f|=(f_G/f)/\{1+[(f_G/f)\alpha-f/f_G\beta]^2\}^{1/2} \quad (16)$$

Since the factor $\beta$ is required for a determination of the value of C in equation (11), the value $\beta$ is achieved by using equation (16) at two different frequencies $f_m$ and $f_n$. This requires empirically determining the gain $|K_f|$ at several different frequencies.

The Table 3 below is an illustrative example of empirical values obtained for a configuration where $\alpha=0.2$ and $f_G=2\times 10^8$.

TABLE 3

| F (mHz) | | $|K_f|$ |
|---|---|---|
| 1 | | 5.00003 |
| 2 | | 5.00012 |
| 5 | } used for determining β | 5.00064 |
| 10 | | 5.00064 |
| 20 | | 4.97227 |
| 40 | | 4.49025 |

Using frequencies of $f_m=5$ mHz and $f_n=10$ mHz, for $|K|_m=|K|_n$ as set forth in equation (16) where $|K_f|=5.00064$, a value of $\beta$ will be obtained which is 1.96014. Using this value and calculating the value of the capacitance C from equation (11) and coupling this value of C across the (−) and (+) inputs 12 and 14 of the op-amp 10 will result in extending the bandwidth beyond the 40 mHz roll-off frequency indicated by Table 1 for the configuration shown in FIG. 2A.

For the inverting operational amplifier configuration depicted in FIG. 2B, it can be shown that the gain $K_f$ at a frequency f is:

$$K_f = -(f_G/f)/(f_G/f \times R_1/R_2 - f/f_C) + j(1+R_1/R_2) \quad (17)$$

The absolute magnitude of the $K_f$ of equation (17) can be expressed as:

$$|K_f| = (f_G/f)/\{(1+R_1/R_2)^2 + (f_G/f \times R_1/R_2 - f/f_C)^2\}^{1/2} \quad (18)$$

From equation (13), $|K_f|$ can be restated as:

$$|K_f| = (f_G/f)/\{1+R_1/R_2)^2 + (f_G/f \times R_1/R_2 - f/\alpha f_G \beta)^2\}^{1/2} \quad (19)$$

For an operational amplifier as shown in FIG. 2B where $R_1/R_2=0.2$, $f_G=2\times10^8$ and letting $F_C=0.2f_G$, the absolute magnitude $|K_f|$ for the frequencies f between 1 mHz and 20 mHz can be calculated using equation (18). The values derived are shown in the following Table 4.

TABLE 4

| f (mHz) | $|K_f|$ |
|---|---|
| 1 | 5.00007 |
| 2 | 5.00026 |
| 5 ⎫ used for determining β | 5.00134 |
| 10 ⎭ | 5.00134 |
| 20 | 4.94195 |

Again using frequencies of $f_m=5$ mHz and $f_n=10$ mHz, letting $|K|_m = |K|_n$ where $|K_f|=5.00134$, and using equation (19), a value of β=1.3487 will be obtained from which C can be obtained as before.

Using this scheme, it is possible to add several operational amplifiers together to obtain a composite gain response over a wider frequency range than otherwise achievable without the capacitor C being coupled across the inputs 12 and 14 of the operational amplifier 10 of FIG. 2.

Figure 3:
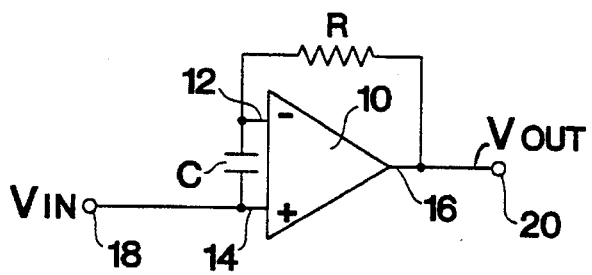
FIG. 3 is a schematic diagram illustrative of a voltage follower type operational amplifier also incorporating the inventive concept of the subject invention.

The inventive concept of adding a capacitance of a predetermined value across the inverting(−) and non-inverting(+) inputs 10 and 12 of an operational amplifier 10 can be extended to other configurations as well. For example, it can be extended to a voltage follower such as shown in FIG. 3 where there is simply provided a single feedback resistor R from the output 16 back to the inverting(−) input 12. The input $V_{in}$ is still coupled to the non-inverting(+) input 14 via input terminal 18, with the output voltage $V_{out}$ being taken from the output terminal 20 coupled to the output 16 of the operational amplifier 10.

In such a circuit, α=1 and thus the absolute gain of the amplifier can be expressed as:

$$|K_f| = (f_G/f)/\{1 + [(f_G/f) - (f/f_G\beta)]^2\}^{1/2} \quad (20)$$

Using the same strategy as before, one empirically determines the absolute gain at several different frequencies where the gains are equal, such as shown by Table 5 below.

TABLE 5

| Freq. (MhZ) | $|K_f|$ |
|---|---|
| 1 | 1.000000 |
| 2 | 1.000000 |
| 5 ⎫ used for determining β | 1.000000 |
| 10 ⎭ | 1.000000 |
| 20 | .9999915 |
| 40 | .9998157 |
| 100 | .992363 |
| 200 | .89457 |

Again, using frequencies of $f_m=5$ mHz and $f_n=10$ mHz in the expression $|K|_m = |K|_n$, a value of β=1.9969 will be obtained from which the value of C can be calculated from equation (7), which when inserted across the inputs 12 and 14 of the circuit shown in FIG. 3, the roll-off frequency can be extended up to 200 mHz as further shown in Table 5.

Thus what has been shown and described is a method and means for extending the useful bandwidth of an operational amplifier used, for example, in analog to digital converters.

Having thus shown and described what is at present considered to be the preferred method and embodiments of the invention, it should be noted that the same has been made by way of illustration and not limitation. Accordingly, all modifications, alterations and changes coming within the spirit and scope of the invention are herein meant to be included.

I claim:

1. A wideband gain stable amplifier circuit, comprising:
    an amplifier having at least one inverting input and one non-inverting input, and an output;
    means for coupling an input signal to one input of said inverting and non-inverting inputs;
    means for coupling an output signal from said output;
    a feedback network coupled between said output and one input of said inverting and non-inverting inputs and feeding a portion of said output signal back to said one input; and
    a capacitive reactance connected across said inputs and having a capacitance value which is inversely proportional to $\alpha f_G \beta$, where $\alpha f_G$ is the closed loop gain with α being said portion of the output signal fed back to said one input and $f_G$ being the gain-bandwidth product between DC or 0 Hz and a 3 dB drop-off frequency and where β is a factor which equates the absolute value of the gain of the amplifier circuit at two different operational frequencies $f_m$ and $f_n$ between 0 Hz and the 3 dB drop-off frequency.

2. The amplifier circuit of claim 1 wherein said amplifier comprises an operational amplifier.

3. The amplifier circuit of claim 2 wherein said input signal is coupled to said non-inverting input and said feedback network is coupled to said inverting input.

4. The amplifier circuit of claim 3 wherein said feedback network comprises a voltage divider network.

5. The amplifier circuit of claim 4 wherein said voltage divider network comprises a first resistor connected between said inverting input and ground and a second resistor connected between said output and said inverting input, thereby forming a non-inverting operational amplifier.

6. The amplifier circuit of claim 5 wherein said factor α comprises the ratio of the value of said first resistor to the sum of the values of said first and second resistors.

7. The amplifier circuit of claim 4 and wherein said capacitive reactance comprises at least one capacitor connected between said inverting and said non-inverting inputs.

8. The amplifier circuit of claim 4 wherein said voltage divider network comprises a first resistor connected between said means for coupling an input signal and said inverting input and a second resistor connected between said output and said inverting input, and wherein said non-inverting input is connected to ground, thereby forming an inverting operational amplifier.

9. The amplifier circuit of claim 8 wherein said factor $\alpha$ comprises the ratio of the value of said first resistor to the value of said second resistor.

10. The amplifier circuit of claim 3 wherein said feedback network comprises at least one resistor connected between said inverting input and said output, thereby forming a voltage follower operational amplifier.

11. The amplifier circuit of claim 10 where said factor $\alpha$ is equal to unity.

12. The amplifier circuit of claim 11 wherein said capacitive reactance comprises at least one capacitor connected between said inverting and non-inverting inputs.

13. The amplifier circuit of claim 2 wherein said input signal is coupled to said inverting input and said feedback network is also coupled to said inverting input.

14. The amplifier circuit of claim 13 wherein said feedback network comprises a voltage divider network.

15. The amplifier circuit of claim 14 wherein said capacitive reactance comprises at least one capacitor connected between said inverting and said non-inverting inputs.

16. A method of increasing the 3 dB drop-off frequency of a wideband amplifier having an inverting input, a non-inverting input and an output, and wherein an input signal is coupled to one of said inputs, comprising the steps of:

adding a feedback network between said output and one input of said inverting and non-inverting inputs and feeding a portion of an output signal back to said one input; and connecting a capacitive reactance across said inverting and non-inverting inputs and having a capacitance value inversely proportional to $\alpha f_G \beta$, where $\alpha f_G$ is the closed loop gain with $\alpha$ being said portion of the output signal fed back to said one input and $f_G$ being the gain-bandwidth product DC or 0 Hz and a 3 dB drop-off frequency and where $\beta$ is a factor which equates the absolute value of the gain of the amplifier circuit at two different operational frequencies $f_m$ and $f_n$ between 0 Hz and the 3 dB drop-off frequency.

17. The method of claim 16 wherein said step of adding a feedback network comprises adding a resistive type feedback network between said output and said inverting input.

18. The method of claim 17 wherein said feedback network comprises a voltage divider network.

\* \* \* \* \*